US012563743B2

(12) United States Patent
Lee et al.

(10) Patent No.: US 12,563,743 B2
(45) Date of Patent: Feb. 24, 2026

(54) SEMICONDUCTOR DEVICE HAVING IMPROVED DEVICE BONDING FEATURES, PERFORMANCE AND RELIABILITY

(71) Applicant: SAMSUNG ELECTRONICS CO., LTD., Suwon-si (KR)

(72) Inventors: Yongjae Lee, Suwon-si (KR); Seung Pil Ko, Suwon-si (KR); Kilho Lee, Suwon-si (KR); Jeongjin Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 383 days.

(21) Appl. No.: 18/448,615

(22) Filed: Aug. 11, 2023

(65) Prior Publication Data

US 2024/0114700 A1 Apr. 4, 2024

(30) Foreign Application Priority Data

Sep. 29, 2022 (KR) ........................ 10-2022-0124616

(51) Int. Cl.
*H10B 61/00* (2023.01)
*H01L 23/00* (2006.01)
(Continued)

(52) U.S. Cl.
CPC ............. *H10B 61/22* (2023.02); *H01L 24/08* (2013.01); *H10B 80/00* (2023.02); *H10F 39/809* (2025.01); *H01L 2224/08145* (2013.01)

(58) Field of Classification Search
CPC .... H10F 39/809; H10N 70/20; H10N 70/231; H10B 63/80; H10B 61/22; H10B 80/00; H01L 2224/08145
(Continued)

(56) References Cited

U.S. PATENT DOCUMENTS 9,997,563 B2 6/2018 Lee et al.
2019/0363130 A1 11/2019 Yokoyama et al.
(Continued)

FOREIGN PATENT DOCUMENTS

JP 2020150177 A 9/2020

*Primary Examiner* — Didarul A Mazumder
(74) *Attorney, Agent, or Firm* — Wolf, Greenfield & Sacks, P.C.

(57) ABSTRACT
A semiconductor device includes cell lower conductive lines and peripheral lower conductive lines on a substrate, lower electrode contacts on the cell lower conductive lines, peripheral conductive contacts on the peripheral lower conductive lines, variable resistance patterns horizontally spaced apart from each other on the lower electrode contacts. The lower electrode contacts are respectively connected to the variable resistance patterns. Peripheral conductive lines are horizontally spaced apart from the variable resistance patterns on the peripheral conductive contacts. The peripheral conductive contacts are connected to the peripheral conductive lines. The cell and peripheral lower conductive lines are connected to the lower electrode contacts and the peripheral conductive contacts, respectively. The cell and peripheral lower conductive lines are at the same height. A pitch of the cell lower conductive lines directly adjacent to each other is greater than a pitch of the peripheral lower conductive lines directly adjacent to each other.

20 Claims, 9 Drawing Sheets

(51) Int. Cl.
    *H10B 80/00*         (2023.01)
    *H10F 39/00*         (2025.01)

(58) Field of Classification Search
    USPC ........................................................ 257/379
    See application file for complete search history.

(56) References Cited

U.S. PATENT DOCUMENTS

| | | |
|---|---|---|
| 2021/0134873 A1 | 5/2021 | Kwon et al. |
| 2021/0257404 A1 | 8/2021 | Lee et al. |
| 2021/0265559 A1 | 8/2021 | Xie et al. |
| 2021/0296397 A1* | 9/2021 | Ko ......................... H10N 50/10 |
| 2021/0305316 A1 | 9/2021 | Wu et al. |
| 2021/0376231 A1 | 12/2021 | Yin et al. |
| 2022/0139975 A1 | 5/2022 | Kimura et al. |
| 2022/0293680 A1* | 9/2022 | Han ....................... H10B 63/20 |

* cited by examiner

216RU

SEMICONDUCTOR DEVICE HAVING IMPROVED DEVICE BONDING FEATURES, PERFORMANCE AND RELIABILITY

CROSS-REFERENCE TO RELATED APPLICATIONS

This U.S. non-provisional patent application claims priority under 35 U.S.C. § 119 to Korean Patent Application No. 10-2022-0124616, filed on Sep. 29, 2022, in the Korean Intellectual Property Office, the entire contents of which are hereby incorporated by reference.

BACKGROUND OF THE INVENTION

The present disclosure relates to a semiconductor device and a method of manufacturing the same, and more particularly, to a semiconductor device including variable resistance patterns and a method of manufacturing the same.

Semiconductor memory devices may be classified into volatile memory devices and non-volatile memory devices. The volatile memory devices may lose their stored data when their power supplies are interrupted, and for example, the volatile memory devices may include dynamic random access memory (DRAM) devices and static random access memory (SRAM) devices. On the contrary, the non-volatile memory devices may retain their stored data even when their power supplies are interrupted, and for example, the non-volatile memory devices may include programmable ROM (PROM), erasable PROM (EPROM), electrically EPROM (EEPROM), and a flash memory device.

In addition, next-generation semiconductor memory devices (e.g., magnetic random access memory (MRAM) devices and phase-change random access memory (PRAM) devices) have been developed to provide high-performance and low power consumption semiconductor memory devices. These next-generation semiconductor memory devices may include variable resistance patterns including materials of which resistance values are variable according to currents or voltages applied thereto, and the variable resistance patterns may retain their resistance values even when the currents or voltages are interrupted. A semiconductor device having an embedded structure in which variable resistance patterns are disposed has been variously studied to satisfy various demands of an electronic industry.

SUMMARY

Embodiments of the inventive concepts may provide a semiconductor device having a structure having improved device bonding features, and a method of manufacturing the same.

Embodiments of the inventive concepts may also provide a semiconductor device with improved performance and reliability, and a method of manufacturing the same.

In an aspect, a semiconductor device includes a substrate, cell lower conductive lines and peripheral lower conductive lines on the substrate, lower electrode contacts on the cell lower conductive lines, peripheral conductive contacts on the peripheral lower conductive lines, variable resistance patterns that are on the lower electrode contacts and are horizontally spaced apart from each other, wherein the lower electrode contacts are connected to respective ones of the variable resistance patterns, and peripheral conductive lines that are on the peripheral conductive contacts and are horizontally spaced apart from the variable resistance patterns, wherein the peripheral conductive contacts are connected to the peripheral conductive lines. The cell lower conductive lines are connected to the lower electrode contacts, the peripheral lower conductive lines are connected to the peripheral conductive contacts, ones of the cell lower conductive lines directly adjacent to each other and ones of the peripheral lower conductive lines directly adjacent to each other are at a same distance from the substrate, and a pitch of the ones of the cell lower conductive lines directly adjacent to each other is greater than a pitch of the ones of the peripheral lower conductive lines directly adjacent to each other.

In an aspect, a semiconductor device includes a first semiconductor chip and a second semiconductor chip stacked on the first semiconductor chip. The first semiconductor chip includes a substrate, cell lower conductive lines and peripheral lower conductive lines on the substrate, lower electrode contacts on the cell lower conductive lines, peripheral conductive contacts on the peripheral lower conductive lines, variable resistance patterns that are on the lower electrode contacts and are horizontally spaced apart from each other, wherein the lower electrode contacts are connected to respective ones of the variable resistance patterns, and peripheral conductive lines that are on the peripheral conductive contacts and are horizontally spaced apart from the variable resistance patterns, wherein the peripheral conductive contacts are connected to the peripheral conductive lines. The cell lower conductive lines are connected to the lower electrode contacts. The peripheral lower conductive lines are connected to the peripheral conductive contacts. Ones of the cell lower conductive lines directly adjacent to each other and ones of the peripheral lower conductive lines directly adjacent to each other are at a same distance from the substrate. A pitch of the ones of the cell lower conductive lines directly adjacent to each other is greater than a pitch of the ones of the peripheral lower conductive lines directly adjacent to each other. A first surface of the first semiconductor chip faces a second surface of the second semiconductor chip. An area of the first surface of the first semiconductor chip ranges from 85% to 115% of an area of the second surface of the second semiconductor chip.

DETAILED DESCRIPTION

Example embodiments of the inventive concepts will now be described more fully with reference to the accompanying drawings.

Figure 1:
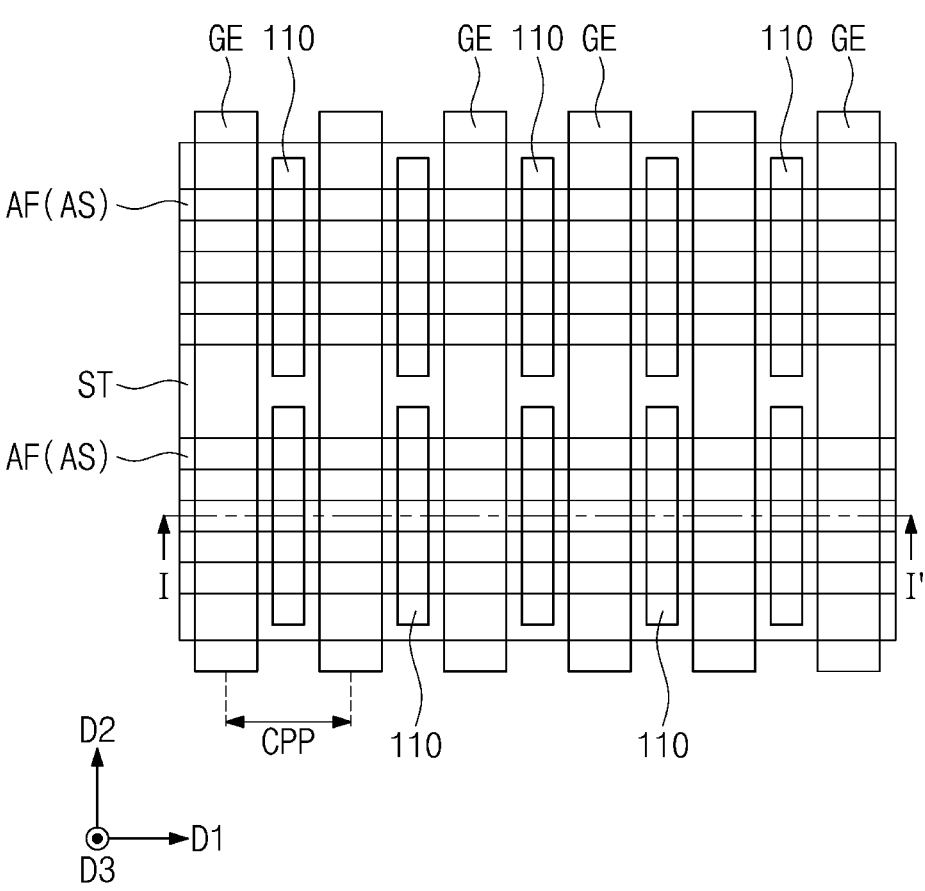
FIG. 1 is a plan view illustrating a portion of a semiconductor device according to some embodiments of the inventive concepts.
Figure 2:
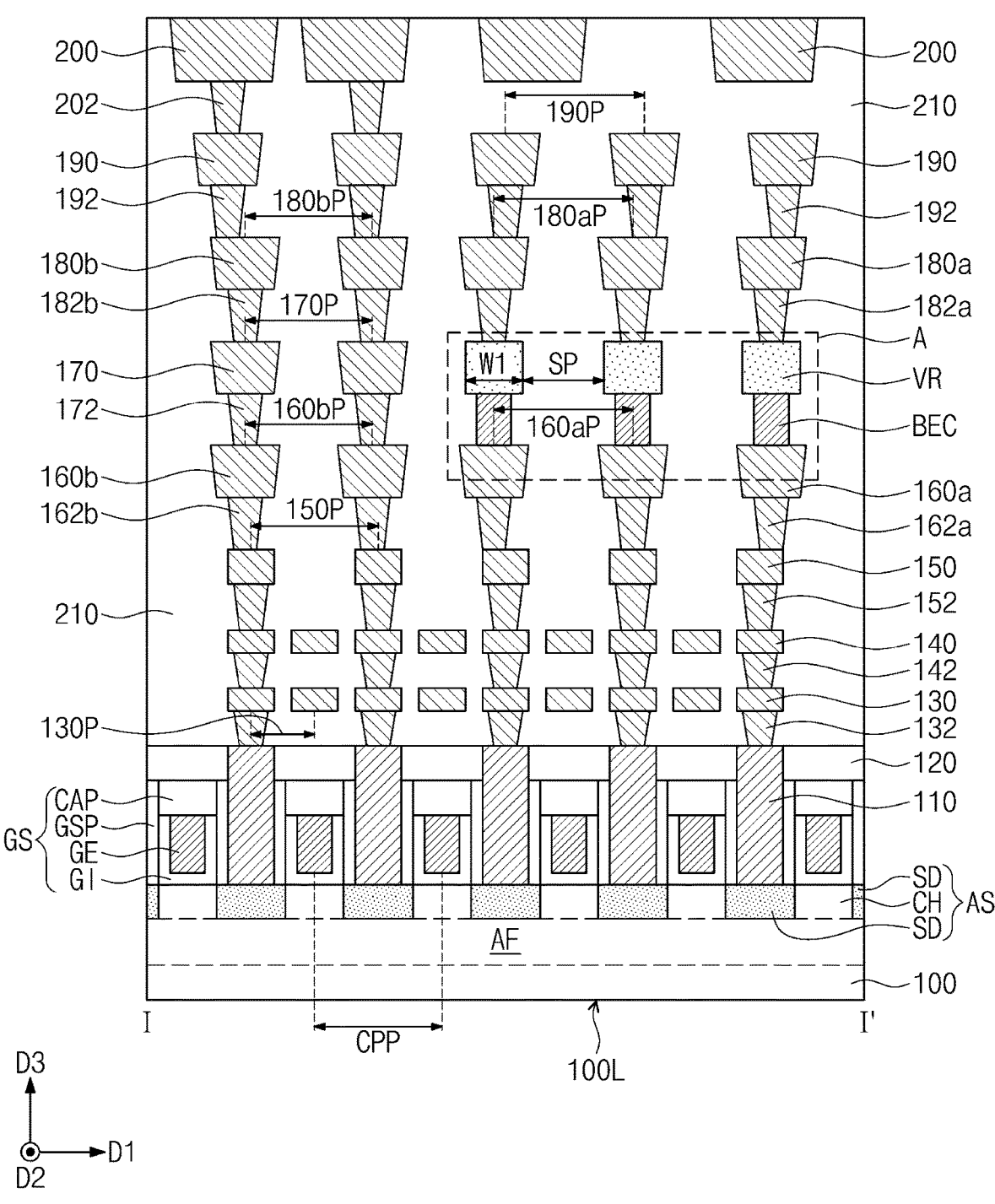
FIG. 2 is a cross-sectional view taken along a line I-I' of FIG. 1.

FIG. 1 is a plan view illustrating a portion of a semiconductor device according to some embodiments of the inventive concepts, and FIG. 2 is a cross-sectional view taken along a line I-I' of FIG. 1.

Referring to FIGS. 1 and 2, an active fin AF may be provided on a substrate 100. The substrate 100 may be a semiconductor substrate. For example, the substrate 100 may be a silicon substrate, a germanium substrate, a silicon-germanium substrate, or a silicon-on-insulator (SOI) substrate, but not limited thereto. The active fin AF may extend in a first direction D1 parallel to a bottom surface 100L of the substrate 100. In some embodiments, the active fin AF may be provided in plurality, and the plurality of active fins AF may be spaced apart from each other in a second direction D2 which is parallel to the bottom surface 100L of the substrate 100 and intersects the first direction D1. The active fin AF may be a portion of the substrate 100, which protrudes in a third direction D3 perpendicular to the bottom surface 100L of the substrate 100.

Device isolation patterns ST may be provided on the substrate 100 at both sides of the active fin AF. The device isolation patterns ST may extend in the first direction D1 and may be spaced apart from each other in the second direction D2 with the active fin AF interposed therebetween. The device isolation patterns ST may include, for example, an oxide, a nitride, and/or an oxynitride, but not limited thereto.

An active structure AS may be provided on the active fin AF. The active structure AS may overlap with the active fin AF when viewed in a plan view. The active structure AS may extend in the first direction D1 along a top surface of the active fin AF. The active structure AS may include channel patterns CH, and source/drain patterns SD spaced apart from each other in the first direction D1 with each of the channel patterns CH interposed therebetween. The channel patterns CH and the source/drain patterns SD may be alternately arranged in the first direction D1 on the top surface of the active fin AF. A plurality of the active structures AS may be provided on the plurality of active fins AF, respectively, and may be spaced apart from each other in the second direction D2.

In some embodiments, each of the channel patterns CH may be an upper portion of the active fin AF, which protrudes from the other portions of the active fin AF (e.g., lower portion of the active fin AF) in the third direction D3. Each of the channel patterns CH may have side surfaces opposite to each other in the second direction D2, and the device isolation patterns ST may expose the side surfaces of each of the channel patterns CH. The source/drain patterns SD may be, for example, epitaxial patterns formed using the active fin AF as a seed. The source/drain patterns SD may include silicon-germanium (SiGe), silicon (Si), and/or silicon carbide (SiC), but not limited thereto. The source/drain patterns SD may be configured to provide tensile strain or compressive strain to each of the channel patterns CH. The source/drain patterns SD may further include dopants. The dopants may be employed to improve electrical characteristics of a transistor including the source/drain patterns SD. When the transistor is an N-channel metal-oxide-semiconductor field effect transistor (NMOSFET), the dopants may include, for example, phosphorus (P). When the transistor is a P-channel metal-oxide-semiconductor field effect transistor (PMOSFET), the dopants may include, for example, boron (B).

A plurality of gate electrodes GE may be disposed on the active structure AS and may intersect the active structure AS. The plurality of gate electrodes GE may be spaced apart from each other in the first direction D1 and may extend in the second direction D2. The plurality of gate electrodes GE may extend in the second direction D2 to intersect the active structure AS, the active fin AF and the device isolation patterns ST. The plurality of gate electrodes GE may vertically overlap with the channel patterns CH of the active structure AS, respectively, and the source/drain patterns SD may be disposed at both sides of each of the plurality of gate electrodes GE. Each of the plurality of gate electrodes GE may extend in the second direction D2 to intersect the plurality of active structures AS.

A gate insulating pattern GI may be disposed between each of the plurality of gate electrodes GE and a corresponding channel pattern CH. Gate spacers GSP may be disposed on side surfaces of each of the plurality of gate electrodes GE, and a gate capping pattern CAP may be disposed on a top surface of each of the plurality of gate electrodes GE. Each of the plurality of gate electrodes GE may extend in the second direction D2 to be on (e.g., cover) a top surface of the corresponding channel pattern CH and top surfaces of the device isolation patterns ST. Each of the plurality of gate electrodes GE may be on (e.g., cover) side surfaces of the corresponding channel pattern CH. The gate insulating pattern GI may extend in the second direction D2 along a bottom surface of each of the plurality of gate electrodes GE. The gate insulating pattern GI may be disposed between each of the plurality of gate electrodes GE and the corresponding channel pattern CH and may extend in the second direction D2 so as to be disposed between each of the plurality of gate electrodes GE and the device isolation patterns ST. The gate insulating pattern GI may extend between each of the plurality of gate electrodes GE and the gate spacers GSP. A topmost surface of the gate insulating pattern GI may be substantially coplanar with the top surface of each of the plurality of gate electrodes GE. The gate capping pattern CAP may be on (e.g., cover) the top surface of each of the plurality of gate electrodes GE and the topmost surface of the gate insulating pattern GI. The gate spacers GSP may extend onto side surfaces of the gate capping pattern CAP. Topmost surfaces of the gate spacers GSP may be substantially coplanar with a top surface of the gate capping pattern CAP. A gate structure GS may include each of the plurality of gate electrodes GE, the gate insulating pattern GI, the gate spacers GSP, and the gate capping pattern CAP. A fin field effect transistor (FINFET) may include each of the plurality of gate electrode GE, the corresponding channel pattern CH, and corresponding source/drain patterns SD.

In some embodiments, each of the channel patterns CH may include a plurality of semiconductor patterns spaced apart from each other in the third direction D3, and each of the plurality of gate electrodes GE may extend between the plurality of semiconductor patterns. In this case, a multi-bridge channel field effect transistor (MBCFET) may include each of the plurality of gate electrodes GE, a corresponding channel pattern CH, and corresponding source/drain patterns SD.

Each of the plurality of gate electrodes GE may include a doped semiconductor material, a conductive metal nitride, and/or a metal, but not limited thereto. The gate insulating pattern GI may include a silicon oxide layer, a silicon nitride layer, a silicon oxynitride layer, and/or a high-k dielectric layer, but not limited thereto. The high-k dielectric layer may include a material (e.g., a hafnium oxide (HfO) layer, an aluminum oxide (AlO) layer, and/or a tantalum oxide (TaO) layer, but not limited thereto) of which a dielectric constant is higher than that of a silicon oxide layer. Each of the gate spacers GSP and the gate capping pattern CAP may include a silicon oxide layer, a silicon nitride layer, and/or a silicon oxynitride layer, but not limited thereto.

A first interlayer insulating layer 120 may be disposed on the substrate 100 and may be disposed on (e.g., cover) a plurality of the gate structures GS and/or the source/drain patterns SD. Each of the plurality of gate structures GS may include each of the plurality of gate electrodes GE, the gate insulating pattern GI, the gate spacers GSP, and the gate capping pattern CAP. The first interlayer insulating layer 120 may include a silicon oxide layer, a silicon nitride layer, a silicon oxynitride layer, and/or a low-k dielectric layer, but not limited thereto.

Source/drain contacts 110 may be disposed at both sides of each of the plurality of gate structures GS (e.g., each of the plurality of gate electrodes GE). Each of the source/drain contacts 110 may penetrate the first interlayer insulating layer 120 between the plurality of gate structures GS (e.g., each of the plurality of gate electrodes GE) and may be (e.g., electrically) connected to a corresponding one of the source/drain patterns SD. Gate contacts may be disposed in the first interlayer insulating layer 120 on the plurality of gate structures GS. Each of the gate contacts may penetrate the first interlayer insulating layer 120 and the gate capping pattern CAP. Each of the gate contacts may be electrically connected to a corresponding one of the plurality of gate electrodes GE. The source/drain contacts 110 and the gate contacts may include a conductive material.

A pitch CPP of the plurality of gate electrodes GE may be referred to as a gate pitch or a contacted poly pitch. For example, the pitch CPP of the plurality of gate electrodes GE may be a minimum distance between centers of a pair of the gate electrodes GE directly adjacent to each other with a corresponding source/drain contact 110 interposed therebetween and may be measured in the first direction D1 across the corresponding source/drain contact 110.

Hereinafter, illustration of components (to be described later) disposed on the first interlayer insulating layer 120 are omitted in FIG. 1 for the purpose of ease and convenience in illustration.

First lower conductive lines 130 may be disposed on the first interlayer insulating layer 120 and may be electrically connected to the source/drain contacts 110 and the gate contacts. First lower vias 132 may be disposed between the first lower conductive lines 130 and the source/drain contacts 110 and between the first lower conductive lines 130 and the gate contacts. The first lower conductive lines 130 may be electrically connected to the source/drain contacts 110 and the gate contacts through the first lower vias 132. The first lower conductive lines 130 may be located at the same height from the substrate 100 and may be horizontally spaced apart from each other. In the present specification, the term 'height' may be a distance measured from the bottom surface 100L of the substrate 100 in the third direction D3. The first lower conductive lines 130 may extend in one direction parallel to the bottom surface 100L of the substrate 100 and may be horizontally spaced apart from each other in another direction which is parallel to the bottom surface 100L of the substrate 100 and intersects the one direction. A pitch 130P of the first lower conductive lines 130 may be a minimum distance between centers of a pair of the first lower conductive lines 130 directly adjacent to each other.

Second lower conductive lines 140 may be disposed on the first lower conductive lines 130 and may be electrically connected to the first lower conductive lines 130. Second lower vias 142 may be disposed between the first lower conductive lines 130 and the second lower conductive lines 140. The second lower conductive lines 140 may be electrically connected to the first lower conductive lines 130 through the second lower vias 142. The second lower conductive lines 140 may be located at the same height from the substrate 100 and may be horizontally spaced apart from each other. The second lower conductive lines 140 may extend in one direction parallel to the bottom surface 100L of the substrate 100 and may be horizontally spaced apart from each other in another direction which is parallel to the bottom surface 100L of the substrate 100 and intersects the one direction. The extension direction of the second lower conductive lines 140 may be the same as or different from the extension direction of the first lower conductive lines 130.

Third lower conductive lines 150 may be disposed on the second lower conductive lines 140 and may be electrically connected to the second lower conductive lines 140. Third lower vias 152 may be disposed between the second lower conductive lines 140 and the third lower conductive lines 150. The third lower conductive lines 150 may be electrically connected to the second lower conductive lines 140 through the third lower vias 152. The third lower conductive lines 150 may be located at the same height from the substrate 100 and may be horizontally spaced apart from each other. The third lower conductive lines 150 may extend in one direction parallel to the bottom surface 100L of the substrate 100 and may be horizontally spaced apart from each other in another direction which is parallel to the bottom surface 100L of the substrate 100 and intersects the one direction. The extension direction of the third lower conductive lines 150 may be the same as or different from the extension direction of the second lower conductive lines 140. A pitch 150P of the third lower conductive lines 150 may be a minimum distance between centers of a pair of the third lower conductive lines 150 directly adjacent to each other.

Fourth lower conductive lines 160a and 160b may be disposed on the third lower conductive lines 150 and may be electrically connected to the third lower conductive lines 150. Fourth lower vias 162a and 162b may be disposed between the third lower conductive lines 150 and the fourth lower conductive lines 160a and 160b. The fourth lower conductive lines 160a and 160b may be electrically connected to the third lower conductive lines 150 through the fourth lower vias 162a and 162b. The fourth lower conductive lines 160a and 160b may be located at the same height from the substrate 100 and may be horizontally spaced apart from each other. The fourth lower conductive lines 160a and 160b may extend in one direction parallel to the bottom surface 100L of the substrate 100 and may be horizontally spaced apart from each other in another direction which is parallel to the bottom surface 100L of the substrate 100 and intersects the one direction. The extension direction of the fourth lower conductive lines 160a and 160b may be the same as or different from the extension direction of the third lower conductive lines 150.

The fourth lower conductive lines 160a and 160b may include cell lower conductive lines 160a electrically connected to variable resistance patterns VR, and peripheral lower conductive lines 160b electrically connected to peripheral conductive lines 170. The fourth lower vias 162a and 162b may include cell lower vias 162a (e.g., electrically) connected to the cell lower conductive lines 160a, and peripheral lower vias 162b (e.g., electrically) connected to the peripheral lower conductive lines 160b. A pitch 160aP of the cell lower conductive lines 160a may be a minimum distance between centers of a pair of the cell lower conductive lines 160a directly adjacent to each other, and a pitch 160bP of the peripheral lower conductive lines 160b may be a minimum distance between centers of a pair of the peripheral lower conductive lines 160b directly adjacent to each other.

The pitch 160aP of the cell lower conductive lines 160a may be greater (the term "greater" in a distance, length, and width may be understood as "longer", and the term "less" in a distance, length, and width may be understood as "shorter" hereinafter) than the pitch 160bP of the peripheral lower conductive lines 160b. The pitch 160aP of the cell lower conductive lines 160a may be greater than the pitch 130P of the first lower conductive lines 130. For example, the pitch 160aP of the cell lower conductive lines 160a may be equal to or greater than 200% of the pitch 130P of the first lower conductive lines 130. In other words, the pitch 160aP of the cell lower conductive lines 160a may be equal to or greater than twice the pitch 130P of the first lower conductive lines 130.

The pitch 160aP of the cell lower conductive lines 160a may be greater than the pitch 150P of the third lower conductive lines 150. For example, the pitch 160aP of the cell lower conductive lines 160a may be equal to or greater than 150% of the pitch 150P of the third lower conductive lines 150. In other words, the pitch 160aP of the cell lower conductive lines 160a may be equal to or greater than 1.5 times the pitch 150P of the third lower conductive lines 150.

The pitch 160aP of the cell lower conductive lines 160a may range from 80% to 120% of the pitch CPP of the plurality of gate electrodes GE. For example, the pitch 160aP of the cell lower conductive lines 160a may be equal to or greater than 80% of the pitch CPP of the plurality of gate electrodes GE and may be equal to or less than 120% of the pitch CPP of the plurality of gate electrodes GE. In other words, the pitch 160aP of the cell lower conductive lines 160a may range from 0.8 times to 1.2 times the pitch CPP of the plurality of gate electrodes GE, and for example, the pitch 160aP of the cell lower conductive lines 160a may be equal to or greater than 0.8 times the pitch CPP of the plurality of gate electrodes GE and may be equal to or less than 1.2 times the pitch CPP of the plurality of gate electrodes GE.

The peripheral conductive lines 170 may be disposed on the peripheral lower conductive lines 160b and may be electrically connected to the peripheral lower conductive lines 160b. Peripheral conductive contacts 172 may be disposed between the peripheral conductive lines 170 and the peripheral lower conductive lines 160b. The peripheral conductive lines 170 may be electrically connected to the peripheral lower conductive lines 160b through the peripheral conductive contacts 172. The peripheral conductive lines 170 may be located at the same height from the substrate 100 and may be horizontally spaced apart from each other. The peripheral conductive lines 170 may extend in one direction parallel to the bottom surface 100L of the substrate 100 and may be horizontally spaced apart from each other in another direction which is parallel to the bottom surface 100L of the substrate 100 and intersects the one direction. The extension direction of the peripheral conductive lines 170 may be the same as or different from the extension direction of the peripheral lower conductive lines 160b. A pitch 170P of the peripheral conductive lines 170 may be a minimum distance between centers of a pair of the peripheral conductive lines 170 directly adjacent to each other. The pitch 160aP of the cell lower conductive lines 160a may be greater than the pitch 170P of the peripheral conductive lines 170.

The variable resistance patterns VR may be disposed on the cell lower conductive lines 160a and may be electrically connected to the cell lower conductive lines 160a. Lower electrode contacts BEC may be disposed between the variable resistance patterns VR and the cell lower conductive lines 160a. The variable resistance patterns VR may be electrically connected to the cell lower conductive lines 160a through the lower electrode contacts BEC. The variable resistance patterns VR may be located at the same height from the substrate 100 and may be horizontally spaced apart from each other. The variable resistance patterns VR may be horizontally spaced apart from each other in two directions which are parallel to the bottom surface 100L of the substrate 100 and intersect each other. A separation distance SP between the variable resistance patterns VR (directly adjacent to each other) may be greater than a width W1 of each of the variable resistance patterns VR. The separation distance SP between the variable resistance patterns VR and the width W1 of each of the variable resistance patterns VR may be measured in a direction parallel to the bottom surface 100L of the substrate 100. The lower electrode contacts BEC may be disposed under the variable resistance patterns VR, respectively, and may be (e.g., electrically) connected to the variable resistance patterns VR, respectively. The peripheral conductive lines 170 may be horizontally spaced apart from the variable resistance patterns VR.

The variable resistance patterns VR may include a material capable of storing information (or data) using its resistivity change. In some embodiments, each of the variable resistance patterns VR may include a magnetic tunnel junction pattern including magnetic layers and a tunnel barrier layer between the magnetic layers. In this case, the variable resistance patterns VR may form memory cells of a magnetic random access memory (MRAM) device. In certain embodiments, each of the variable resistance patterns VR may include a material of which a phase is reversibly changeable between a crystalline phase and an amorphous phase by, for example, temperature, and for example, each of the variable resistance patterns VR may include, but not limited thereto, a compound including Te and/or Se (i.e., chalcogen elements) and Ge, Sb, Bi, Pb, Sn, Ag, As, S, Si, In, and/or Ga. In this case, the variable resistance patterns VR may form memory cells of a phase-change random access memory (PRAM) device. In certain embodiments, each of the variable resistance patterns VR may include, for example, a perovskite compound and/or a conductive metal oxide. In this case, the variable resistance patterns VR may form memory cells of a resistive random access memory (RRAM) device.

The lower electrode contacts BEC may include, for example, a doped semiconductor material (e.g., doped silicon), a metal (e.g., tungsten, titanium, and/or tantalum), a metal-semiconductor compound (e.g., a metal silicide), and/or a conductive metal nitride (e.g., titanium nitride, tantalum nitride, and/or tungsten nitride).

First upper conductive lines 180a and 180b may be disposed on the variable resistance patterns VR and the peripheral conductive lines 170 and may be electrically connected to the variable resistance patterns VR and the peripheral conductive lines 170. First upper vias 182a and 182b may be disposed between the variable resistance patterns VR and the first upper conductive lines 180a and 180b and between the peripheral conductive lines 170 and the first upper conductive lines 180a and 180b. The first upper conductive lines 180a and 180b may be electrically connected to the variable resistance patterns VR and the peripheral conductive lines 170 through the first upper vias 182*a* and 182*b*. The first upper conductive lines 180*a* and 180*b* may be located at the same height from the substrate 100 and may be horizontally spaced apart from each other. The first upper conductive lines 180*a* and 180*b* may extend in one direction parallel to the bottom surface 100L of the substrate 100 and may be horizontally spaced apart from each other in another direction which is parallel to the bottom surface 100L of the substrate 100 and intersects the one direction. The extension direction of the first upper conductive lines 180*a* and 180*b* may be the same as or different from the extension direction of the peripheral conductive lines 170.

The first upper conductive lines 180*a* and 180*b* may include cell upper conductive lines 180*a* electrically connected to the variable resistance patterns VR, and peripheral upper conductive lines 180*b* electrically connected to the peripheral conductive lines 170. The first upper vias 182*a* and 182*b* may include cell upper vias 182*a* disposed between the cell upper conductive lines 180*a* and the variable resistance patterns VR, and peripheral upper vias 182*b* disposed between the peripheral upper conductive lines 180*b* and the peripheral conductive lines 170. The cell upper conductive lines 180*a* may be electrically connected to the variable resistance patterns VR through the cell upper vias 182*a*, and the peripheral upper conductive lines 180*b* may be electrically connected to the peripheral conductive lines 170 through the peripheral upper vias 182*b*. A pitch 180*a*P of the cell upper conductive lines 180*a* may be a minimum distance between centers of a pair of the cell upper conductive lines 180*a* directly adjacent to each other, and a pitch 180*b*P of the peripheral upper conductive lines 180*b* may be a minimum distance between centers of a pair of the peripheral upper conductive lines 180*b* directly adjacent to each other.

The pitch 180*a*P of the cell upper conductive lines 180*a* may be greater than the pitch 180*b*P of the peripheral upper conductive lines 180*b*. The pitch 180*a*P of the cell upper conductive lines 180*a* may be greater than the pitch 170P of the peripheral conductive lines 170. The pitch 180*a*P of the cell upper conductive lines 180*a* may be greater than the pitch 160*b*P of the peripheral lower conductive lines 160*b*. The pitch 160*a*P of the cell lower conductive lines 160*a* may be greater than the pitch 180*b*P of the peripheral upper conductive lines 180*b*.

The pitch 180*a*P of the cell upper conductive lines 180*a* may be greater than the pitch 130P of the first lower conductive lines 130. For example, the pitch 180*a*P of the cell upper conductive lines 180*a* may be equal to or greater than 200% of the pitch 130P of the first lower conductive lines 130. In other words, the pitch 180*a*P of the cell upper conductive lines 180*a* may be equal to or greater than twice the pitch 130P of the first lower conductive lines 130.

The pitch 180*a*P of the cell upper conductive lines 180*a* may be greater than the pitch 150P of the third lower conductive lines 150. For example, the pitch 180*a*P of the cell upper conductive lines 180*a* may be equal to or greater than 150% of the pitch 150P of the third lower conductive lines 150. In other words, the pitch 180*a*P of the cell upper conductive lines 180*a* may be equal to or greater than 1.5 times the pitch 150P of the third lower conductive lines 150.

The pitch 180*a*P of the cell upper conductive lines 180*a* may range from 80% to 120% of the pitch CPP of the plurality of gate electrodes GE. For example, the pitch 180*a*P of the cell upper conductive lines 180*a* may be equal to or greater than 80% of the pitch CPP of the plurality of gate electrodes GE and may be equal to or less than 120% of the pitch CPP of the plurality of gate electrodes GE. In other words, the pitch 180*a*P of the cell upper conductive lines 180*a* may range from 0.8 times to 1.2 times the pitch CPP of the plurality of gate electrodes GE, and for example, the pitch 180*a*P of the cell upper conductive lines 180*a* may be equal to or greater than 0.8 times the pitch CPP of the plurality of gate electrodes GE and may be equal to or less than 1.2 times the pitch CPP of the plurality of gate electrodes GE.

Second upper conductive lines 190 may be disposed on the first upper conductive lines 180*a* and 180*b* and may be electrically connected to the first upper conductive lines 180*a* and 180*b*. Second upper vias 192 may be disposed between the second upper conductive lines 190 and the first upper conductive lines 180*a* and 180*b*. The second upper conductive lines 190 may be electrically connected to the first upper conductive lines 180*a* and 180*b* through the second upper vias 192. The second upper conductive lines 190 may be located at the same height from the substrate 100 and may be horizontally spaced apart from each other. The second upper conductive lines 190 may extend in one direction parallel to the bottom surface 100L of the substrate 100 and may be horizontally spaced apart from each other in another direction which is parallel to the bottom surface 100L of the substrate 100 and intersects the one direction. The extension direction of the second upper conductive lines 190 may be the same as or different from the extension direction of the first upper conductive lines 180*a* and 180*b*.

A pitch 190P of the second upper conductive lines 190 may be a minimum distance between centers of a pair of the second upper conductive lines 190 directly adjacent to each other. The pitch 160*a*P of the cell lower conductive lines 160*a* may be equal to or greater than the pitch 190P of the second upper conductive lines 190, and the pitch 180*a*P of the cell upper conductive lines 180*a* may be equal to or greater than the pitch 190P of the second upper conductive lines 190.

Third upper conductive lines 200 may be disposed on the second upper conductive lines 190 and may be electrically connected to the second upper conductive lines 190. Third upper vias 202 may be disposed between the third upper conductive lines 200 and the second upper conductive lines 190. The third upper conductive lines 200 may be electrically connected to the second upper conductive lines 190 through the third upper vias 202. The third upper conductive lines 200 may be located at the same height from the substrate 100 and may be horizontally spaced apart from each other. The third upper conductive lines 200 may extend in one direction parallel to the bottom surface 100L of the substrate 100 and may be horizontally spaced apart from each other in another direction which is parallel to the bottom surface 100L of the substrate 100 and intersects the one direction. The extension direction of the third upper conductive lines 200 may be the same as or different from the extension direction of the second upper conductive lines 190.

The first to fourth lower conductive lines 130, 140, 150, 160*a* and 160*b*, the first to fourth lower vias 132, 142, 152, 162*a* and 162*b*, the peripheral conductive lines 170, the peripheral conductive contacts 172, the first to third upper conductive lines 180*a*, 180*b*, 190 and 200 and the first to third upper vias 182*a*, 182*b*, 192 and 202 may include a metal (e.g., copper), but not limited thereto.

A second interlayer insulating layer 210 may be disposed on the first interlayer insulating layer 120 and may be on (e.g., cover) the first to fourth lower conductive lines 130, 140, 150, 160*a* and 160*b*, the first to fourth lower vias 132, 142, 152, 162*a* and 162*b*, the peripheral conductive lines 170, the peripheral conductive contacts 172, the lower electrode contacts BEC, the variable resistance patterns VR, the first to third upper conductive lines 180*a*, 180*b*, 190, and 200, and/or the first to third upper vias 182*a*, 182*b*, 192 and 202. The second interlayer insulating layer 210 may include a silicon oxide layer, a silicon nitride layer, a silicon oxynitride layer, and/or a low-k dielectric layer, but not limited thereto.

According to the inventive concepts, the cell lower conductive lines 160*a* (e.g., electrically) connected to the variable resistance patterns VR may be formed to have the pitch (e.g., 160*a*P) greater than those (e.g., 160*b*P, 170P, and 180*b*P) of the peripheral lower conductive lines 160*b*, the peripheral conductive lines 170 and the peripheral upper conductive lines 180*b*. In addition, the cell upper conductive lines 180*a* (e.g., electrically) connected to the variable resistance patterns VR may be formed to have the pitch (e.g., 180*a*P) greater than those (e.g., 160*b*P, 170P, and 180*b*P) of the peripheral lower conductive lines 160*b*, the peripheral conductive lines 170 and the peripheral upper conductive lines 180*b*. Thus, the separation distance SP between the variable resistance patterns VR provided between the cell lower conductive lines 160*a* and the cell upper conductive lines 180*a* may be increased. Accordingly, the variable resistance patterns VR may be separated from each other at a longer distance, and influence between the variable resistance patterns VR adjacent to each other may be reduced. As a result, reliability of the semiconductor device including the variable resistance patterns VR may be improved.

In addition, the first to third lower conductive lines 130, 140 and 150, the peripheral lower conductive lines 160*b*, the peripheral conductive lines 170 and the peripheral upper conductive lines 180*b* may be formed to have the pitches (e.g., 130P, 150P, 160*b*P, 170P, and 180*b*P) less than those of the cell lower conductive lines 160*a* and the cell upper conductive lines 180*a* (e.g., 160*a*P and 180*a*P). As a result, design rules of the first to third lower conductive lines 130, 140, and 150, the peripheral lower conductive lines 160*b*, the peripheral conductive lines 170, and the peripheral upper conductive lines 180*b* may be reduced, and thus performance of the semiconductor device may be improved.

Thus, the semiconductor device with excellent performance and excellent reliability may be provided.

Figure 3:
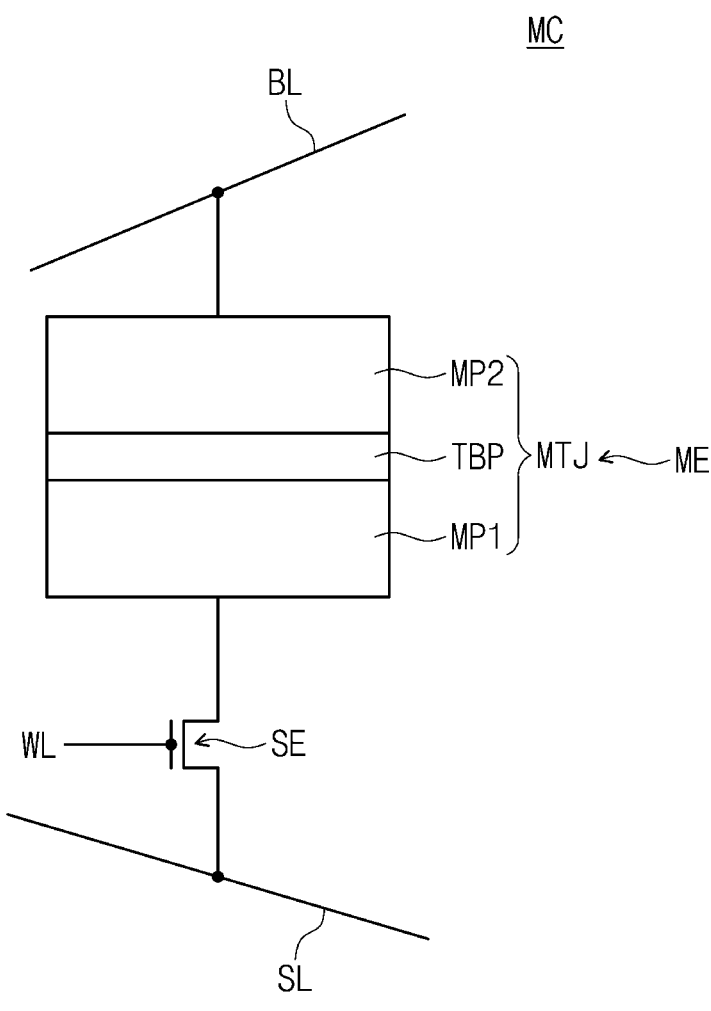
FIG. 3 is a circuit diagram illustrating a unit memory cell of a semiconductor device according to some embodiments of the inventive concepts.
Figure 4:
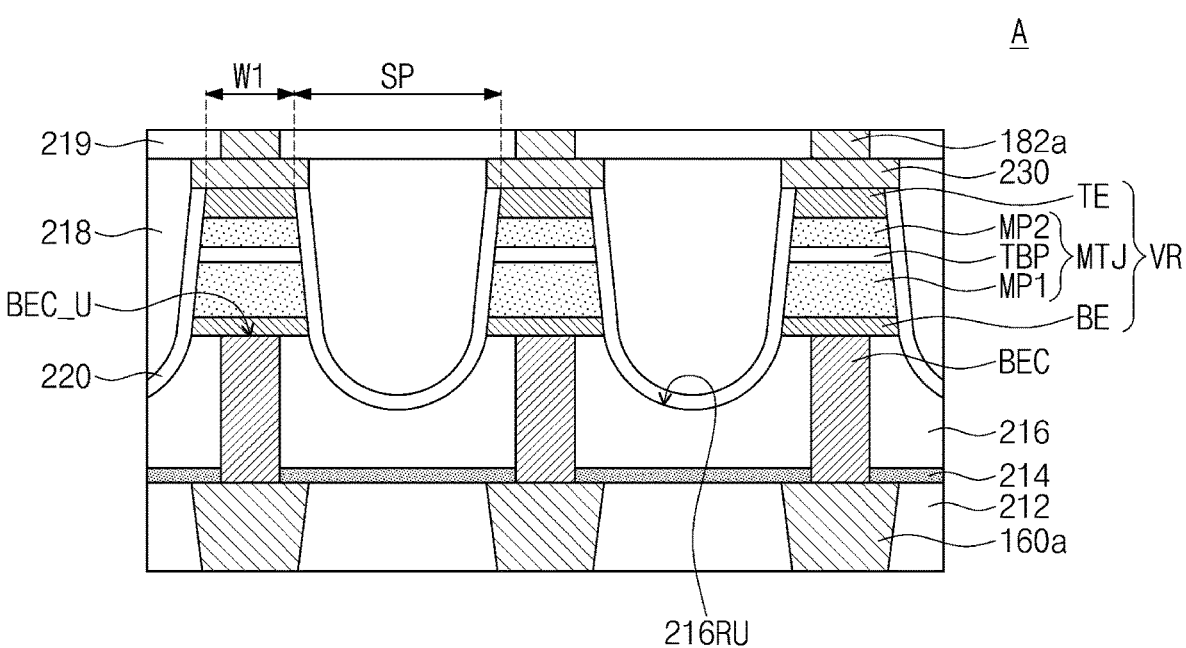
FIG. 4 is an enlarged view of a portion 'A' of FIG. 2 to illustrate a portion of a semiconductor device according to some embodiments of the inventive concepts.
Figure 5A:
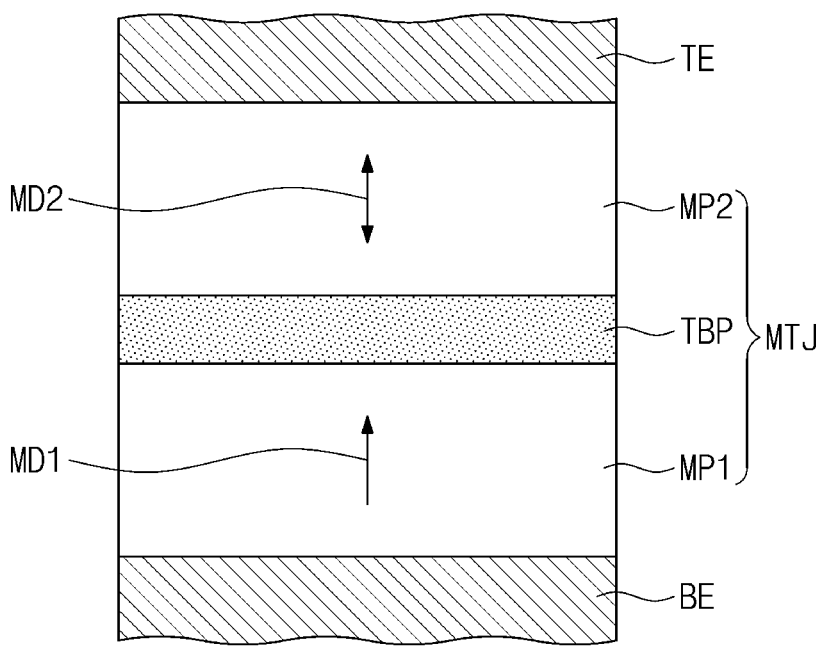
FIGS. 5A and 5B are cross-sectional views illustrating examples of a magnetic tunnel junction pattern of FIG. 4.
Figure 5B:
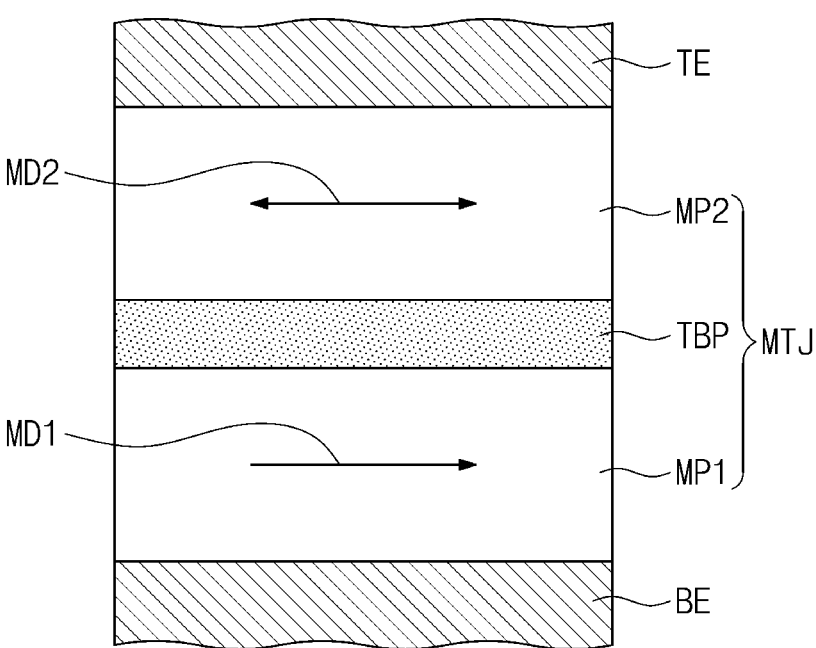

FIG. 3 is a circuit diagram illustrating a unit memory cell of a semiconductor device according to some embodiments of the inventive concepts. FIG. 4 is an enlarged view of a portion 'A' of FIG. 2 to illustrate a portion of a semiconductor device according to some embodiments of the inventive concepts. FIGS. 5A and 5B are cross-sectional views illustrating examples of a magnetic tunnel junction pattern of FIG. 4.

Referring to FIG. 3, a unit memory cell MC may include a memory element ME and a selection element SE. The memory element ME and the selection element SE may be electrically connected to each other. The memory element ME may be (e.g., electrically) connected between a bit line BL and the selection element SE. The selection element SE may be (e.g., electrically) connected between the memory element ME and a source line SL and may be controlled by a word line WL. In some embodiments, the fin field effect transistor (FINFET) or the multi-bridge channel field effect transistor (MBCFET) described with reference to FIGS. 1 and 2 may function as the selection element SE.

The memory element ME may include a magnetic tunnel junction pattern MTJ including magnetic patterns MP1 and MP2 spaced apart from each other and a tunnel barrier pattern TBP between the magnetic patterns MP1 and MP2. One of the magnetic patterns MP1 and MP2 may be a reference magnetic pattern of which a magnetization direction is fixed in one direction regardless of an external magnetic field under a general use environment. The other of the magnetic patterns MP1 and MP2 may be a free magnetic pattern of which a magnetization direction is changeable (e.g., between two stable magnetization directions) by an external magnetic field. An electrical resistance of the magnetic tunnel junction pattern MTJ when the magnetization directions of the reference and free magnetic patterns are antiparallel to each other may be much greater than that of the magnetic tunnel junction pattern MTJ when the magnetization directions of the reference and free magnetic patterns are parallel to each other. In other words, the electrical resistance of the magnetic tunnel junction pattern MTJ may be adjusted by changing the magnetization direction of the free magnetic pattern. Thus, data may be stored in the memory element ME of the unit memory cell MC by using an electrical resistance difference according to the magnetization directions of the reference and free magnetic patterns.

Referring to FIGS. 2 and 4, the cell lower conductive lines 160*a* may be disposed in a first interconnection insulating layer 212. The first interconnection insulating layer 212 may expose a portion of top surfaces of the cell lower conductive lines 160*a*. For example, the first interconnection insulating layer 212 may include silicon oxide, silicon nitride, and/or silicon oxynitride.

A protective insulating layer 214 may be disposed on the first interconnection insulating layer 212 and may be on (e.g., cover) a portion of the exposed top surfaces of the cell lower conductive lines 160*a*. For example, the protective insulating layer 214 may include silicon oxide, silicon nitride, and/or silicon oxynitride.

A lower insulating layer 216 may be disposed on the protective insulating layer 214, and the lower electrode contacts BEC may be disposed in the lower insulating layer 216. Each of the lower electrode contacts BEC may penetrate the lower insulating layer 216 and the protective insulating layer 214 and may be electrically connected to a corresponding one of the cell lower conductive lines 160*a*. For example, the lower insulating layer 216 may include silicon oxide, silicon nitride, and/or silicon oxynitride.

The variable resistance patterns VR may be disposed on the lower insulating layer 216 and may be disposed on the lower electrode contacts BEC, respectively. The lower insulating layer 216 may have a top surface 216RU recessed toward the substrate 100 between the variable resistance patterns VR. The recessed top surface 216RU of the lower insulating layer 216 may be located at a lower height than top surfaces BEC_U of the lower electrode contacts BEC with respect to the bottom surface 100L of the substrate 100.

Each of the variable resistance patterns VR may include a lower electrode BE, a magnetic tunnel junction pattern MTJ and an upper electrode TE, which are sequentially stacked on each of the lower electrode contacts BEC. The lower electrode BE may be disposed between each of the lower electrode contacts BEC and the magnetic tunnel junction pattern MTJ, and the magnetic tunnel junction pattern MTJ may be disposed between the lower electrode BE and the upper electrode TE. The magnetic tunnel junction pattern MTJ may include a first magnetic pattern MP1, a second magnetic pattern MP2, and a tunnel barrier pattern TBP disposed between the first and second magnetic patterns MP1 and MP2. The first magnetic pattern MP1 may be disposed between the lower electrode BE and the tunnel barrier pattern TBP, and the second magnetic pattern MP2 may be disposed between the upper electrode TE and the tunnel barrier pattern TBP. For example, the lower electrode BE may include a conductive metal nitride (e.g., titanium nitride or tantalum nitride). For example, the upper electrode TE may include a metal (e.g., Ta, W, Ru, and/or Ir) and/or a conductive metal nitride (e.g., TiN).

Referring to FIGS. 5A and 5B, the first magnetic pattern MP1 may be a reference layer having a magnetization direction MD1 fixed in one direction, and the second magnetic pattern MP2 may be a free layer having a magnetization direction MD2 changeable to be parallel or antiparallel to the magnetization direction MD1 of the first magnetic pattern MP1. FIGS. 5A and 5B illustrate examples in which the second magnetic pattern MP2 is the free layer, but embodiments of the inventive concepts are not limited thereto. Unlike FIGS. 5A and 5B, the first magnetic pattern MP1 may be the free layer, and the second magnetic pattern MP2 may be the reference layer.

Referring to FIG. 5A, in some embodiments, the magnetization directions MD1 and MD2 of the first magnetic pattern MP1 and the second magnetic pattern MP2 may be substantially perpendicular to an interface between the tunnel barrier pattern TBP and the second magnetic pattern MP2. In this case, each of the first and second magnetic patterns MP1 and MP2 may include an intrinsic perpendicular magnetic material and/or an extrinsic perpendicular magnetic material. The intrinsic perpendicular magnetic material may include a material which has a perpendicular magnetization property (e.g., perpendicular to the interface between the tunnel barrier pattern TBP and the second magnetic pattern MP2) even though an external factor does not exist. The intrinsic perpendicular magnetic material may include, for example, a perpendicular magnetic material (e.g., CoFeTb, CoFeGd, and/or CoFeDy), a perpendicular magnetic material having a $L1_0$ structure, a CoPt alloy having a hexagonal close packed (HCP) lattice structure, and/or a perpendicular magnetic structure. The perpendicular magnetic material having the $L1_0$ structure may include, for example, FePt having the $L1_0$ structure, FePd having the $L1_0$ structure, CoPd having the $L1_0$ structure, and/or CoPt having the $L1_0$ structure. The perpendicular magnetic structure may include magnetic layers and non-magnetic layers, which are alternately and repeatedly stacked. For example, the perpendicular magnetic structure may include (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n, where 'n' denotes the number of bilayers. The extrinsic perpendicular magnetic material may include a material which has an intrinsic horizontal magnetization property but has a perpendicular magnetization property (e.g., perpendicular to the interface between the tunnel barrier pattern TBP and the second magnetic pattern MP2) by an external factor. For example, the extrinsic perpendicular magnetic material may have the perpendicular magnetization property due to magnetic anisotropy induced by a junction of the first magnetic pattern MP1 (or the second magnetic pattern MP2) and the tunnel barrier pattern TBP. The extrinsic perpendicular magnetic material may include, for example, CoFeB, but not limited thereto.

Referring to FIG. 5B, in certain embodiments, the magnetization directions MD1 and MD2 of the first magnetic pattern MP1 and the second magnetic pattern MP2 may be parallel to the interface between the tunnel barrier pattern TBP and the second magnetic pattern MP2. In this case, each of the first magnetic pattern MP1 and the second magnetic pattern MP2 may include, for example, a ferromagnetic material. The first magnetic pattern MP1 may further include an antiferromagnetic material for pinning a magnetization direction of the ferromagnetic material in the first magnetic pattern MP1.

In certain embodiments, each of the first magnetic pattern MP1 and the second magnetic pattern MP2 may include a Co-based Heusler alloy. The tunnel barrier pattern TBP may include, for example, a magnesium (Mg) oxide layer, a titanium (Ti) oxide layer, an aluminum (Al) oxide layer, a magnesium-zinc (Mg—Zn) oxide layer, and/or a magnesium-boron (Mg—B) oxide layer.

Referring again to FIGS. 2 and 4, the separation distance SP between the variable resistance patterns VR may be greater than the width W1 of each of the variable resistance patterns VR.

A capping insulating layer 220 may be disposed on the lower insulating layer 216. The capping insulating layer 220 may conformally cover (e.g., be on) the recessed top surface 216RU of the lower insulating layer 216. The capping insulating layer 220 may extend onto a portion of a side surface of each of the variable resistance patterns VR. The capping insulating layer 220 may conformally cover (e.g., be on) side surfaces of the lower electrode BE, the magnetic tunnel junction pattern MTJ and the upper electrode TE. The capping insulating layer 220 may include, for example, a nitride (e.g., silicon nitride), but not limited thereto.

An upper insulating layer 218 may be disposed on the lower insulating layer 216. The upper insulating layer 218 may be on (e.g., cover) a portion of the variable resistance patterns VR. The upper insulating layer 218 may fill a space between the variable resistance patterns VR. The capping insulating layer 220 may be disposed between the side surface of each of the variable resistance patterns VR and the upper insulating layer 218 and may extend between the recessed top surface 216RU of the lower insulating layer 216 and the upper insulating layer 218. For example, the upper insulating layer 218 may include silicon oxide, silicon nitride, and/or silicon oxynitride.

Bit lines 230 may be disposed in the upper insulating layer 218. The bit lines 230 may penetrate an upper portion of the upper insulating layer 218 so as to be (e.g., electrically) connected to the upper electrodes TE of the variable resistance patterns VR. Each of the variable resistance patterns VR may be electrically connected to a corresponding one of the bit lines 230. The bit lines 230 may include a conductive material and may include, for example, a metal (e.g., copper). In some embodiments, the bit lines 230, the peripheral conductive lines 170 and the peripheral conductive contacts 172 may include the same material. The bit lines 230 may function as the bit lines BL of FIG. 3. The upper insulating layer 218 may expose (portions of) top surfaces of the bit lines 230.

A second interconnection insulating layer 219 may be disposed on the upper insulating layer 218. The second interconnection insulating layer 219 may be on (e.g., cover) portions of the exposed (portions of) top surfaces of the bit lines 230. For example, the second interconnection insulating layer 219 may include silicon oxide, silicon nitride, and/or silicon oxynitride. The cell upper vias 182a may penetrate the second interconnection insulating layer 219 so as to be electrically connected to the bit lines 230.

The second interlayer insulating layer 210 may include the first interconnection insulating layer 212, the protective insulating layer 214, the lower insulating layer 216, the capping insulating layer 220, the upper insulating layer 218, and the second interconnection insulating layer 219.

According to the embodiments of the inventive concepts, the cell lower conductive lines 160a and the cell upper conductive lines 180*a* may be formed to have the pitches greater than those of the peripheral lower conductive lines 160*b*, the peripheral conductive lines 170 and the peripheral upper conductive lines 180*b*. Thus, the separation distance SP between the variable resistance patterns VR provided between the cell lower conductive lines 160*a* and the cell upper conductive lines 180*a* may increase. In some embodiments, the variable resistance patterns VR may include the magnetic tunnel junction patterns MTJ. Since the separation distance SP between the variable resistance patterns VR is increased, the magnetic tunnel junction patterns MTJ may be separated from each other at a longer distance and influence between the magnetic tunnel junction patterns MTJ adjacent to each other may be reduced. Thus, reliability of the semiconductor device including the magnetic tunnel junction patterns MTJ may be improved.

In addition, the first to third lower conductive lines 130, 140 and 150, the peripheral lower conductive lines 160*b*, the peripheral conductive lines 170 and the peripheral upper conductive lines 180*b* may be formed to have the pitches less than those of the cell lower conductive lines 160*a* and the cell upper conductive lines 180*a*. As a result, design rules of the first to third lower conductive lines 130, 140 and 150, the peripheral lower conductive lines 160*b*, the peripheral conductive lines 170 and the peripheral upper conductive lines 180*b* may be reduced, and thus performance of the semiconductor device including the magnetic tunnel junction patterns MTJ may be improved.

Figure 6:
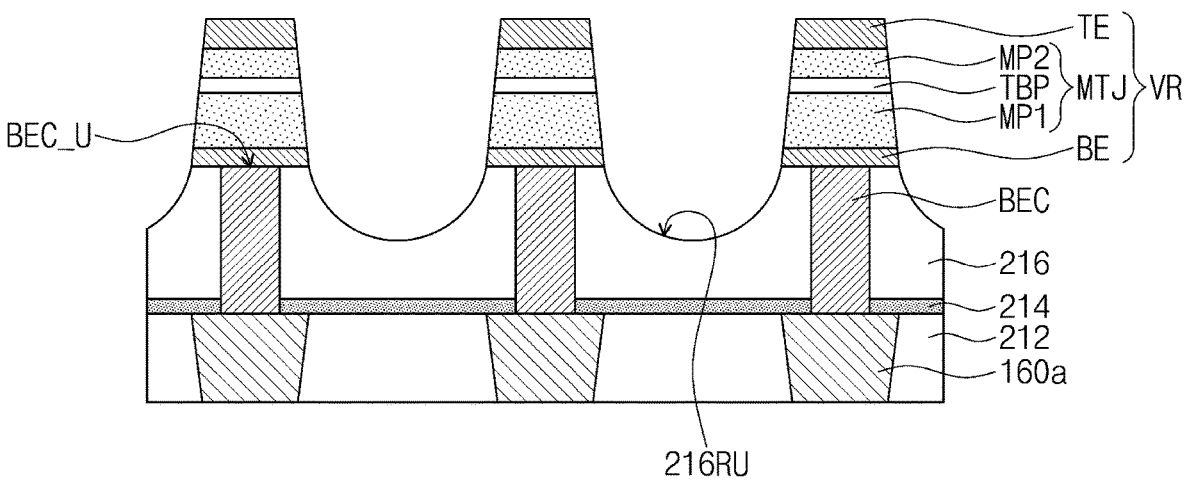
FIGS. 6 to 8 are enlarged views corresponding to the portion 'A' of FIG. 2 to illustrate a method of manufacturing a semiconductor device according to some embodiments of the inventive concepts.
Figure 7:
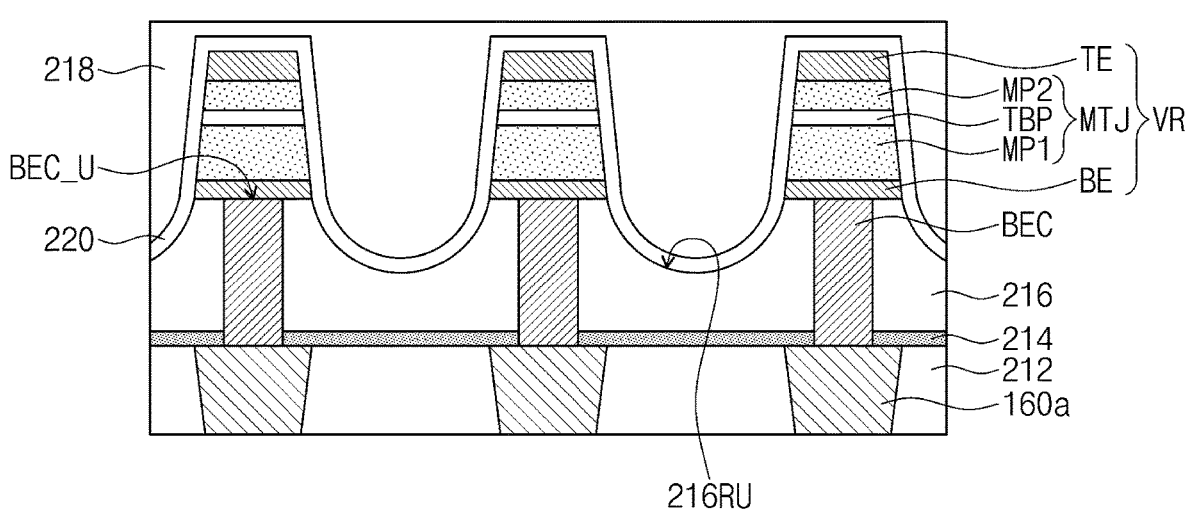
Figure 8:
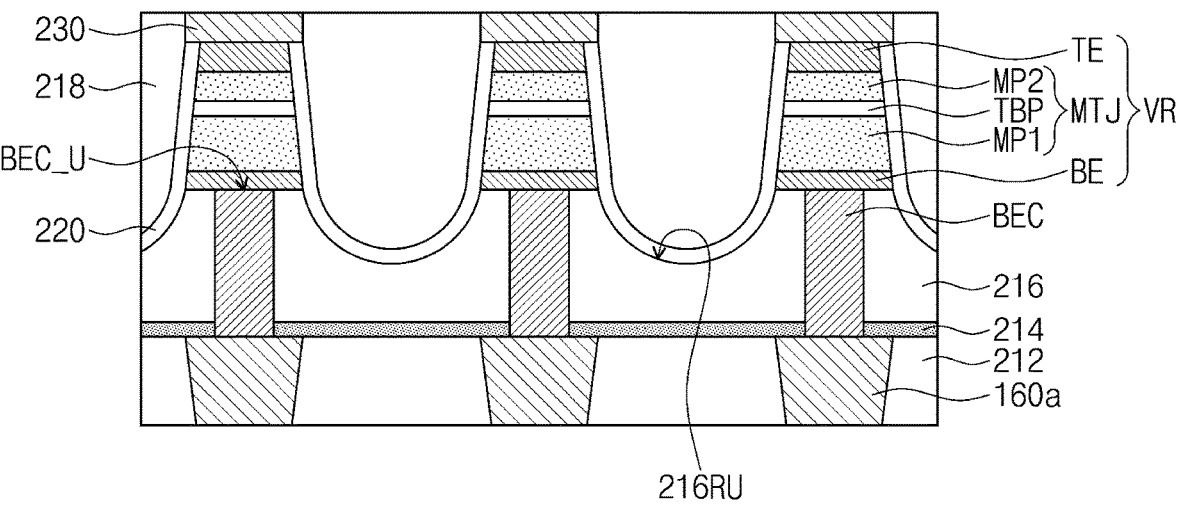

FIGS. 6 to 8 are enlarged views corresponding to the portion 'A' of FIG. 2 to illustrate a method of manufacturing a semiconductor device according to some embodiments of the inventive concepts. The descriptions to the same features as mentioned with reference to FIGS. 1 to 4, 5A and 5B will be omitted hereinafter for the purpose of ease and convenience in explanation.

Referring to FIG. 2, the active fins AF, the active structures AS, the gate structures GS, the first interlayer insulating layer 120, the source/drain contacts 110 and the gate contacts may be formed on the substrate 100. The first to third lower conductive lines 130, 140 and 150 and the first to fourth lower vias 132, 142, 152, 162*a* and 162*b* may be formed on the first interlayer insulating layer 120, and a portion of the second interlayer insulating layer 210 may be formed on the first interlayer insulating layer 120 and on (e.g., cover) the first to third lower conductive lines 130, 140 and 150 and the first to fourth lower vias 132, 142, 152, 162*a* and 162*b*.

Referring to FIGS. 2 and 6, a first interconnection insulating layer 212 may be formed on the fourth lower vias 162*a* and 162*b*. The cell lower conductive lines 160*a* and the peripheral lower conductive lines 160*b* may be formed in the first interconnection insulating layer 212. The first interconnection insulating layer 212 may expose a portion of top surfaces of the cell lower conductive lines 160*a* and a portion of top surfaces of the peripheral lower conductive lines 160*b*. A protective insulating layer 214 may be formed on the first interconnection insulating layer 212. The protective insulating layer 214 may be on (e.g., cover) a portion of the exposed top surfaces of the cell lower conductive lines 160*a* and a portion of the exposed top surfaces of the peripheral lower conductive lines 160*b*. A lower insulating layer 216 may be formed on the protective insulating layer 214.

The lower electrode contacts BEC may be formed in the lower insulating layer 216. Each of the lower electrode contacts BEC may penetrate the lower insulating layer 216 and the protective insulating layer 214 and may be electrically connected to a corresponding one of the cell lower conductive lines 160*a*. For example, the formation of the lower electrode contacts BEC may include forming lower contact holes penetrating the lower insulating layer 216 and the protective insulating layer 214, forming a lower contact layer filling the lower contact holes on the lower insulating layer 216, and planarizing the lower contact layer to expose a top surface of the lower insulating layer 216. By the planarization process, the lower electrode contacts BEC may be locally formed in the lower contact holes, respectively.

The variable resistance patterns VR may be formed on the lower insulating layer 216 and may be formed on the lower electrode contacts BEC, respectively. Each of the variable resistance patterns VR may include a lower electrode BE, a magnetic tunnel junction pattern MTJ and an upper electrode TE, which are sequentially stacked on each of the lower electrode contacts BEC. The magnetic tunnel junction pattern MTJ may include a first magnetic pattern MP1, a second magnetic pattern MP2, and a tunnel barrier pattern TBP disposed between the first and second magnetic patterns MP1 and MP2. For example, the formation of the variable resistance patterns VR may include sequentially forming a lower electrode layer and a magnetic tunnel junction layer on the lower insulating layer 216, forming a conductive mask pattern on the magnetic tunnel junction layer, and sequentially etching the magnetic tunnel junction layer and the lower electrode layer by using the conductive mask pattern as an etch mask. The magnetic tunnel junction layer may include a first magnetic layer, a tunnel barrier layer and a second magnetic layer, which are sequentially stacked on the lower electrode layer. For example, the magnetic tunnel junction layer and the lower electrode layer may be formed using a sputtering process, a chemical vapor deposition (CVD) process, and/or an atomic layer deposition (ALD) process.

The magnetic tunnel junction layer and the lower electrode layer may be etched to form the magnetic tunnel junction pattern MTJ and the lower electrode BE, respectively. The etching of the magnetic tunnel junction layer may include sequentially etching the second magnetic layer, the tunnel barrier layer and the first magnetic layer by using the conductive mask pattern as the etch mask. The second magnetic layer, the tunnel barrier layer and the first magnetic layer may be etched to form the second magnetic pattern MP2, the tunnel barrier pattern TBP and the first magnetic pattern MP1, respectively. A remaining portion of the conductive mask pattern on the magnetic tunnel junction pattern MTJ after the etching of the magnetic tunnel junction layer and the lower electrode layer may be referred to as the upper electrode TE.

For example, the etching process of etching the magnetic tunnel junction layer and the lower electrode layer may be an ion beam etching process using an ion beam, but not limited thereto. The ion beam may include inert ions. An upper portion of the lower insulating layer 216 between the variable resistance patterns VR may be recessed by the etching process. Thus, the lower insulating layer 216 may have a top surface 216RU recessed toward the substrate 100. The recessed top surface 216RU of the lower insulating layer 216 may be located at a lower height than top surfaces BEC_U of the lower electrode contacts BEC (with respect to the bottom surface 100L of the substrate 100).

Referring to FIGS. 2 and 7, a capping insulating layer 220 may be formed on the lower insulating layer 216. The capping insulating layer 220 may conformally cover (e.g., be on) a top surface and a side surface of each of the variable resistance patterns VR. The capping insulating layer 220 may extend along the recessed top surface 216RU of the lower insulating layer 216.

An upper insulating layer 218 may be formed on the capping insulating layer 220. The upper insulating layer 218 may be on (e.g., cover) the variable resistance patterns VR and may fill a space between the variable resistance patterns VR.

Referring to FIGS. 2 and 8, bit lines 230 may be formed in the upper insulating layer 218. The bit lines 230 may penetrate an upper portion of the upper insulating layer 218 so as to be (e.g., electrically) connected to the upper electrodes TE of the variable resistance patterns VR. The peripheral conductive lines 170 and the peripheral conductive contacts 172 may be formed simultaneously with the bit lines 230. For example, the formation of the bit lines 230, the peripheral conductive lines 170 and the peripheral conductive contacts 172 may include forming a cell trench which penetrates the upper insulating layer 218 and exposes a portion of the upper electrode TE of each of the variable resistance patterns VR, forming a peripheral trench penetrating a portion of the second interlayer insulating layer 210, forming a peripheral hole which extends from a bottom surface of the peripheral trench toward the substrate 100 and exposes a portion of a top surface of a corresponding one of the peripheral lower conductive lines 160b, forming a conductive layer filling the cell trench, the peripheral trench and the peripheral hole on the upper insulating layer 218, and planarizing the conductive layer to expose a top surface of the upper insulating layer 218.

Referring again to FIGS. 2 and 4, a second interconnection insulating layer 219 may be formed on the upper insulating layer 218. The second interconnection insulating layer 219 may be on (e.g., cover) (a portion of) the bit lines 230 and (a portion of) the peripheral conductive lines 170. The cell upper vias 182a and the peripheral upper vias 182b may be formed to penetrate the second interconnection insulating layer 219. The cell upper vias 182a may penetrate the second interconnection insulating layer 219 so as to be electrically connected to the bit lines 230, and the peripheral upper vias 182b may penetrate the second interconnection insulating layer 219 so as to be electrically connected to the peripheral conductive lines 170.

Thereafter, the first to third upper conductive lines 180a, 180b, 190 and 200 and the second and third upper vias 192 and 202 may be formed on the cell upper vias 182a and the peripheral upper vias 182b. A portion of the second interlayer insulating layer 210 may be formed to be on (e.g., to cover) the first to third upper conductive lines 180a, 180b, 190 and 200 and the second and third upper vias 192 and 202.

FIGS. 9 to 12 are cross-sectional views schematically illustrating examples of a structure in which different semiconductor chips are stacked.

Figure 9:
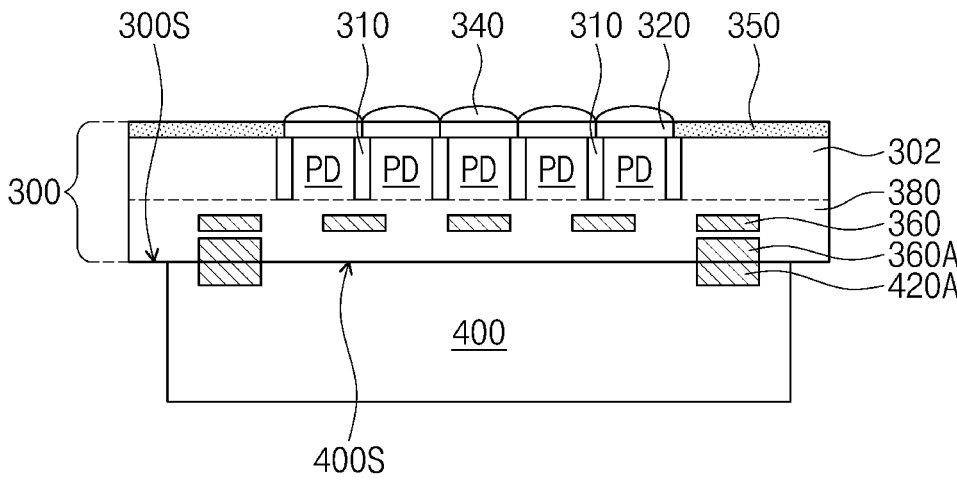
FIGS. 9 to 12 are cross-sectional views schematically illustrating examples of a structure in which different semiconductor chips are stacked.
Figure 10:
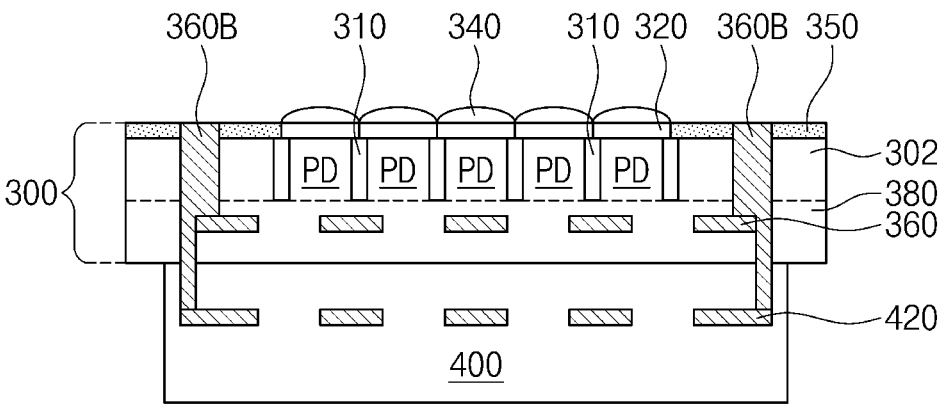

Referring to FIGS. 9 and 10, a second semiconductor chip 300 may be stacked on a first semiconductor chip 400. The first semiconductor chip 400 may include the semiconductor device described with reference to FIGS. 1 to 4, 5A and 5B.

The second semiconductor chip 300 may include an image sensor, but not limited thereto. More particularly, the second semiconductor chip 300 may include a plurality of photoelectric conversion regions PD formed in a semiconductor substrate 302, deep device isolation patterns 310 penetrating the semiconductor substrate 302 and disposed between the photoelectric conversion regions PD, color filters 320 disposed on one surface of the semiconductor substrate 302 and vertically overlapping with the photoelectric conversion regions PD, micro lenses 340 disposed on the one surface of the semiconductor substrate 302 and vertically overlapping with the color filters 320 and the photoelectric conversion regions PD, light blocking patterns 350 disposed on the one surface of the semiconductor substrate 302, interconnection patterns 360 disposed on another surface of the semiconductor substrate 302, and an insulating layer 380 disposed on the another surface of the semiconductor substrate 302 and covering (e.g., disposed on) the interconnection patterns 360.

Referring to FIG. 9, in some embodiments, the first semiconductor chip 400 may include first interconnection pads 420A, and the first interconnection pads 420A may include, for example, a metal (e.g., copper). For example, some of the third upper conductive lines 200 of FIG. 2 may function as the first interconnection pads 420A. Alternatively, the first interconnection pads 420A may be electrically connected to the third upper conductive lines 200 of FIG. 2. The second semiconductor chip 300 may further include second interconnection pads 360A disposed in the insulating layer 380. The second interconnection pads 360A may include, for example, a metal (e.g., copper). The second interconnection pads 360A may be electrically connected to the interconnection patterns 360. The first interconnection pads 420A of the first semiconductor chip 400 may be (e.g., directly) bonded to the second interconnection pads 360A of the second semiconductor chip 300. Thus, the first semiconductor chip 400 and the second semiconductor chip 300 may be bonded to each other and may be electrically connected to each other.

Referring to FIG. 10, in certain embodiments, the first semiconductor chip 400 may include interconnection lines 420. For example, some of the third upper conductive lines 200 of FIG. 2 may function as the interconnection lines 420. Alternatively, the interconnection lines 420 may be electrically connected to the third upper conductive lines 200 of FIG. 2. The second semiconductor chip 300 may further include a through-electrode 360B penetrating the light blocking pattern 350, the semiconductor substrate 302 and the insulating layer 380. The through-electrode 360B may be electrically connected to a corresponding one of the interconnection patterns 360. The through-electrode 360B may extend into the first semiconductor chip 400 and may be electrically connected to a corresponding one of the interconnection lines 420. The first semiconductor chip 400 and the second semiconductor chip 300 may be bonded to each other and electrically connected to each other by the through-electrode 360B.

According to the inventive concepts, the cell lower conductive lines 160a and the cell upper conductive lines 180a, which are (e.g., electrically) connected to the variable resistance patterns VR, may be formed to have the pitches greater than those of the peripheral lower conductive lines 160b, the peripheral conductive lines 170 and the peripheral upper conductive lines 180b. As a result, a size of the first semiconductor chip 400 may be increased, and thus a difference in size between the first semiconductor chip 400 and the second semiconductor chip 300 may be reduced.

For example, a first surface 400S of the first semiconductor chip 400 and a second surface 300S of the second semiconductor chip 300 may face each other and may be bonded to each other. A difference in area between the first surface 400S and the second surface 300S may be 15% or less. In other words, an area of the first surface 400S of the first semiconductor chip 400 may range from 85% to 115% (i.e., 0.85 times to 1.15 times) of an area of the second surface 300S of the second semiconductor chip 300. The area of the first surface 400S of the first semiconductor chip 400 may be less than the area of the second surface 300S of the second semiconductor chip 300. For example, the area of the first surface 400S of the first semiconductor chip 400 may be equal to or greater than 85% of the area of the second surface 300S of the second semiconductor chip 300 and may be less than 100% of the area of the second surface 300S of the second semiconductor chip 300. In other words, the area of the first surface 400S of the first semiconductor chip 400 may be equal to or greater than 0.85 times the area of the second surface 300S of the second semiconductor chip 300 and may be less than 1.0 time the area of the second surface 300S of the second semiconductor chip 300.

According to the inventive concepts, the difference in size between the first semiconductor chip 400 and the second semiconductor chip 300 (e.g., the difference in area between the first surface 400S and the second surface 300S) may be controlled to 15% or less, and thus it is possible to reduce a defect (e.g., chip breakage, reduction in heat dissipation, etc.) which may be caused due to the difference in size between the first semiconductor chip 400 and the second semiconductor chip 300. As a result, the semiconductor device having a structure capable of being bonded to another semiconductor chip with fewer defects may be provided.

Figure 11:
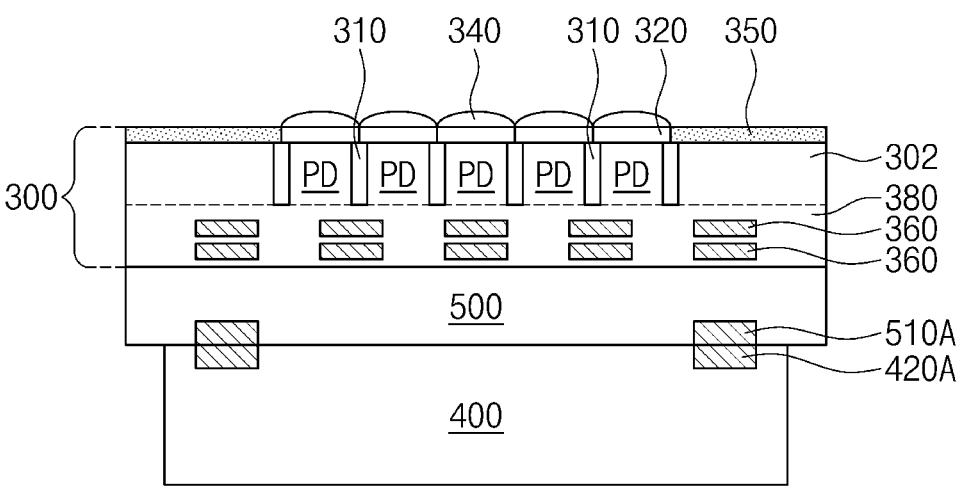
Figure 12:
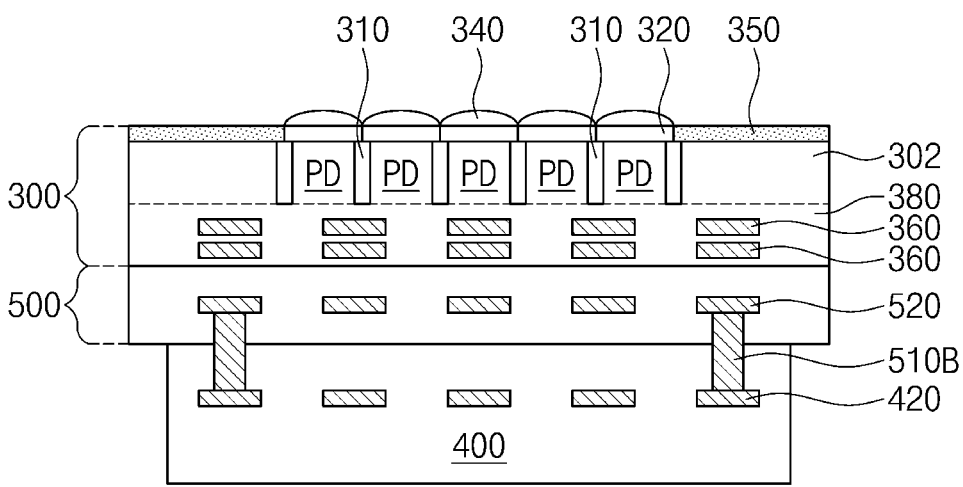

Referring to FIGS. 11 and 12, in some embodiments, a third semiconductor chip 500 may be disposed between the first semiconductor chip 400 and the second semiconductor chip 300, and the first to third semiconductor chips 400, 300 and 500 may be bonded to each other. For example, the third semiconductor chip 500 may include a dynamic random access memory (DRAM) device, but not limited thereto.

Referring to FIG. 11, in some embodiments, the third semiconductor chip 500 may include third interconnection pads 510A, and the first semiconductor chip 400 may include the first interconnection pads 420A. The first interconnection pads 420A of the first semiconductor chip 400 may be (e.g., directly) bonded to the third interconnection pads 510A of the third semiconductor chip 500. Thus, the first semiconductor chip 400 and the third semiconductor chip 500 may be bonded to each other and may be electrically connected to each other.

Referring to FIG. 12, in certain embodiments, the third semiconductor chip 500 may further include additional interconnection patterns 520 and an additional through-electrode 510B. The additional through-electrode 510B may be electrically connected to a corresponding one of the additional interconnection patterns 520. The additional through-electrode 510B may extend into the first semiconductor chip 400 and may be electrically connected to a corresponding one of the interconnection lines 420 of the first semiconductor chip 400. The first semiconductor chip 400 and the third semiconductor chip 500 may be bonded to each other and electrically connected to each other by the additional through-electrode 510B.

According to the inventive concepts, the cell lower conductive lines 160a and the cell upper conductive lines 180a, which are (e.g., electrically) connected to the variable resistance patterns VR, may be formed to have the pitches greater than those of the peripheral lower conductive lines 160b, the peripheral conductive lines 170 and the peripheral upper conductive lines 180b. As a result, a size of the first semiconductor chip 400 may be increased, and thus a difference in size between the first semiconductor chip 400 and the third semiconductor chip 500 (e.g., the difference in area between a surface of the first semiconductor chip 400 and a surface of the third semiconductor chip 500 that face to each other) may be reduced.

According to the inventive concepts, the cell lower and upper conductive lines (e.g., electrically) connected to the variable resistance patterns may be formed to have the pitches greater than those of the conductive lines adjacent thereto. Thus, it may increase the separation distance between the variable resistance patterns disposed between the cell lower conductive lines and the cell upper conductive lines. Therefore, the influence between the variable resistance patterns adjacent to each other may be reduced. As a result, the reliability of the semiconductor device including the variable resistance patterns may be improved.

In addition, the conductive lines adjacent to the cell lower conductive lines and the cell upper conductive lines may be formed to have relatively small pitches. As a result, the design rule of the conductive lines may be reduced, and thus the performance of the semiconductor device may be improved.

Thus, it is possible to provide the semiconductor device with the improved performance and improved reliability and the method of manufacturing the same.

While the embodiments of the inventive concepts have been particularly shown and described, it will be understood by one of ordinary skill in the art that variations in form and detail may be made therein without departing from the spirit and scope of the attached claims. It should also be noted that in some alternate implementations, the steps of the method of manufacturing or the steps of operations herein may occur out of the order. For example, two steps described in succession may in fact be executed substantially concurrently or the steps may sometimes be executed in the reverse order. Moreover, the steps of method or operation may be separated into multiple steps and/or may be at least partially integrated. Finally, other steps may be added/inserted between the steps that are illustrated, and/or the steps may be omitted without departing from the scope of the present invention.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. In addition, "electrical connection" conceptually includes a physical connection and a physical disconnection. As used herein, the term "and/or" includes any and all combinations of one or more of the associated listed items. Moreover, the symbol "/" will be understood to be equivalent to the term "and/or."

It will be understood that when an element is "on" a surface, the surface may face the element.

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a substrate;
   cell lower conductive lines and peripheral lower conductive lines on the substrate;
   lower electrode contacts on the cell lower conductive lines;
   peripheral conductive contacts on the peripheral lower conductive lines;
   variable resistance patterns that are on the lower electrode contacts and are horizontally spaced apart from each other, wherein the lower electrode contacts are connected to respective ones of the variable resistance patterns; and
   peripheral conductive lines that are on the peripheral conductive contacts and are horizontally spaced apart from the variable resistance patterns, wherein the peripheral conductive contacts are connected to the peripheral conductive lines,
   wherein the cell lower conductive lines are connected to the lower electrode contacts,
   wherein the peripheral lower conductive lines are connected to the peripheral conductive contacts,
   wherein ones of the cell lower conductive lines directly adjacent to each other and ones of the peripheral lower conductive lines directly adjacent to each other are at a same distance from the substrate, and
   wherein a pitch of the ones of the cell lower conductive lines directly adjacent to each other is greater than a pitch of the ones of the peripheral lower conductive lines directly adjacent to each other.

2. The semiconductor device of claim 1, further comprising:
   cell upper conductive lines on the variable resistance patterns and connected to the variable resistance patterns; and
   peripheral upper conductive lines on the peripheral conductive lines and connected to the peripheral conductive lines,
   wherein ones of the cell upper conductive lines directly adjacent to each other and ones of the peripheral upper conductive lines directly adjacent to each other are at a same distance from the substrate, and
   wherein a pitch of the ones of the cell upper conductive lines directly adjacent to each other is greater than a pitch of the ones of the peripheral upper conductive lines directly adjacent to each other.

3. The semiconductor device of claim 2, wherein the pitch of the ones of the cell lower conductive lines directly adjacent to each other is greater than a pitch of ones of the peripheral conductive lines directly adjacent to each other and is greater than the pitch of the ones of the peripheral upper conductive lines directly adjacent to each other.

4. The semiconductor device of claim 2, wherein the pitch of the ones of the cell upper conductive lines directly adjacent to each other is greater than a pitch of ones of the peripheral conductive lines directly adjacent to each other and is greater than the pitch of the ones of the peripheral lower conductive lines directly adjacent to each other.

5. The semiconductor device of claim 2, further comprising:
   cell upper vias between the variable resistance patterns and the cell upper conductive lines, wherein the cell upper vias connect the variable resistance patterns to the cell upper conductive lines; and
   peripheral upper vias between the peripheral conductive lines and the peripheral upper conductive lines, wherein the peripheral upper vias connect the peripheral conductive lines to the peripheral upper conductive lines.

6. The semiconductor device of claim 2, wherein the cell upper conductive lines and the peripheral upper conductive lines are first upper conductive lines, the semiconductor device further comprises:
   second upper conductive lines on the first upper conductive lines and connected to the first upper conductive lines,
   wherein ones of the second upper conductive lines directly adjacent to each other are at a same distance from the substrate, and
   wherein the pitch of the ones of the cell upper conductive lines directly adjacent to each other is equal to or greater than a pitch of the ones of the second upper conductive lines directly adjacent to each other.

7. The semiconductor device of claim 6, wherein the pitch of the ones of the cell lower conductive lines directly adjacent to each other is equal to or greater than the pitch of the ones of the second upper conductive lines directly adjacent to each other.

8. The semiconductor device of claim 1, further comprising:
   an active structure on the substrate and extending in a first direction parallel to a bottom surface of the substrate;
   gate electrodes intersecting the active structure and spaced apart from each other in the first direction; and

source/drain contacts between the gate electrodes and connected to the active structure, wherein the cell lower conductive lines and the peripheral lower conductive lines are on the active structure, on the gate electrodes, and on the source/drain contacts, and wherein the pitch of the ones of the cell lower conductive lines directly adjacent to each other ranges from 80% to 120% of a pitch of ones of the gate electrodes directly adjacent to each other.

9. The semiconductor device of claim 8, further comprising:

first lower conductive lines between first ones of the source/drain contacts and the cell lower conductive lines and between second ones of the source/drain contacts and the peripheral lower conductive lines, wherein the first lower conductive lines are at a same distance from the substrate and at least one of the first lower conductive lines is connected to the source/drain contacts, and wherein the pitch of the ones of the cell lower conductive lines directly adjacent to each other is greater than a pitch of ones of the first lower conductive lines directly adjacent to each other.

10. The semiconductor device of claim 9, further comprising:

third lower conductive lines between first ones of the first lower conductive lines and the cell lower conductive lines and between second ones of the first lower conductive lines and the peripheral lower conductive lines, wherein the third lower conductive lines are at a same distance from the substrate and are connected to the cell lower conductive lines and/or the peripheral lower conductive lines, and wherein the pitch of the ones of the cell lower conductive lines directly adjacent to each other is greater than a pitch of ones of the third lower conductive lines directly adjacent to each other.

11. The semiconductor device of claim 10, further comprising:

second lower conductive lines between the first lower conductive lines and the third lower conductive lines, wherein the second lower conductive lines connect the first and third lower conductive lines to each other.

12. The semiconductor device of claim 1, wherein a distance between the variable resistance patterns directly adjacent to each other in a first direction parallel to a bottom surface of the substrate is greater than a width of each of the variable resistance patterns in the first direction.

13. The semiconductor device of claim 12, wherein the variable resistance patterns comprise magnetic tunnel junction patterns.

14. A semiconductor device comprising:

a first semiconductor chip; and a second semiconductor chip stacked on the first semiconductor chip, wherein the first semiconductor chip comprises:

a substrate;

cell lower conductive lines and peripheral lower conductive lines on the substrate;

lower electrode contacts on the cell lower conductive lines;

peripheral conductive contacts on the peripheral lower conductive lines;

variable resistance patterns that are on the lower electrode contacts and are horizontally spaced apart from each other, wherein the lower electrode contacts are connected to respective ones of the variable resistance patterns; and peripheral conductive lines that are on the peripheral conductive contacts and are horizontally spaced apart from the variable resistance patterns, wherein the peripheral conductive contacts are connected to the peripheral conductive lines, wherein the cell lower conductive lines are connected to the lower electrode contacts, wherein the peripheral lower conductive lines are connected to the peripheral conductive contacts, wherein ones of the cell lower conductive lines directly adjacent to each other and ones of the peripheral lower conductive lines directly adjacent to each other are at a same distance from the substrate, wherein a pitch of the ones of the cell lower conductive lines directly adjacent to each other is greater than a pitch of the ones of the peripheral lower conductive lines directly adjacent to each other, wherein a first surface of the first semiconductor chip faces a second surface of the second semiconductor chip, and wherein an area of the first surface of the first semiconductor chip ranges from 85% to 115% of an area of the second surface of the second semiconductor chip.

15. The semiconductor device of claim 14, wherein the area of the first surface of the first semiconductor chip is less than the area of the second surface of the second semiconductor chip.

16. The semiconductor device of claim 14, wherein the second semiconductor chip comprises an image sensor.

17. The semiconductor device of claim 14, wherein the first semiconductor chip further comprises:

cell upper conductive lines on the variable resistance patterns and connected to the variable resistance patterns; and peripheral upper conductive lines on the peripheral conductive lines and connected to the peripheral conductive lines, wherein ones of the cell upper conductive lines directly adjacent to each other and ones of the peripheral upper conductive lines directly adjacent to each other are at a same distance from the substrate, and wherein a pitch of the ones of the cell upper conductive lines directly adjacent to each other is greater than a pitch of the ones of the peripheral upper conductive lines directly adjacent to each other.

18. The semiconductor device of claim 17, wherein the pitch of the ones of the cell lower conductive lines directly adjacent to each other is greater than a pitch of ones of the peripheral conductive lines directly adjacent to each other and is greater than the pitch of the ones of the peripheral upper conductive lines directly adjacent to each other, and wherein the pitch of the ones of the cell upper conductive lines directly adjacent to each other is greater than the pitch of the ones of the peripheral conductive lines directly adjacent to each other and is greater than the pitch of the ones of the peripheral lower conductive lines directly adjacent to each other.

19. The semiconductor device of claim 14, wherein the first semiconductor chip further comprises:

an active structure on the substrate and extending in a first direction parallel to a bottom surface of the substrate;

gate electrodes intersecting the active structure and spaced apart from each other in the first direction; and source/drain contacts between the gate electrodes and connected to the active structure, wherein the cell lower conductive lines and the peripheral lower conductive lines are on the active structures, on the gate electrodes, and on the source/drain contacts, and wherein the pitch of the ones of the cell lower conductive lines directly adjacent to each other ranges from 80% to 120% of a pitch of ones of the gate electrodes directly adjacent to each other.

20. The semiconductor device of claim 14, wherein a distance between the variable resistance patterns directly adjacent to each other in a first direction parallel to a bottom surface of the substrate is greater than a width of each of the variable resistance patterns in the first direction.

* * * * *